United States Patent
Koduka et al.

(10) Patent No.: US 9,671,469 B2
(45) Date of Patent: Jun. 6, 2017

(54) VOLTAGE DETECTION CIRCUIT

(75) Inventors: Yuusuke Koduka, Toyohashi (JP); Mitsuhiro Kamo, Hamamatsu (JP); Tsuyoshi Miyahara, Hamamatsu (JP)

(73) Assignee: PRIMEARTH EV ENERGY CO., LTD., Kosai-shi, Shizuoka (JP)

( * ) Notice: Subject to any disclaimer, the term of this patent is extended or adjusted under 35 U.S.C. 154(b) by 845 days.

(21) Appl. No.: 13/997,985

(22) PCT Filed: Sep. 22, 2011

(86) PCT No.: PCT/JP2011/071700
§ 371 (c)(1),
(2), (4) Date: Jun. 25, 2013

(87) PCT Pub. No.: WO2012/090558
PCT Pub. Date: Jul. 5, 2012

(65) Prior Publication Data
US 2013/0285667 A1    Oct. 31, 2013

(30) Foreign Application Priority Data
Dec. 27, 2010    (JP) ................................ 2010-290936

(51) Int. Cl.
*G01N 27/416*    (2006.01)
*G01R 31/36*    (2006.01)
*G01R 19/00*    (2006.01)

(52) U.S. Cl.
CPC ..... *G01R 31/3606* (2013.01); *G01R 19/0084* (2013.01); *G01R 31/362* (2013.01); *G01R 31/3658* (2013.01)

(58) Field of Classification Search
USPC ......................................................... 324/433
See application file for complete search history.

(56) References Cited

U.S. PATENT DOCUMENTS

| 4,868,411 A | 9/1989 | Ishihara | |
| 5,652,501 A * | 7/1997 | McClure | ............... H02J 7/0019 320/118 |
| 6,362,627 B1 | 3/2002 | Shimamoto | |

(Continued)

FOREIGN PATENT DOCUMENTS

| JP | 60-71964 A | 4/1985 |
| JP | 11-248755 A | 9/1999 |

(Continued)

OTHER PUBLICATIONS

International Search Report mailed Dec. 20, 2011, issued in corresponding International Application No. PCT/JP2011/071700, filed Sep. 22, 2011, 4 pages.

*Primary Examiner* — Yalkew Fantu
(74) *Attorney, Agent, or Firm* — Christensen O'Connor Johnson Kindness PLLC; Jadran Mihailovic; Laura Cruz

(57) ABSTRACT

A voltage detection circuit for a secondary battery. A secondary battery is composed of a plurality of battery blocks (B1) to (B3), and is connected to a flying capacitor (C1) via input side sampling switches (SW1) to (SW3). The flying capacitor (C1) is connected to a differential amplifier circuit (10) via output side sampling switches (SWa) and (SWb). A feedback capacitor (C2) is connected to an inverting input terminal of the differential amplifier circuit (10) to form an integrator circuit, which reduces the capacitance of the flying capacitor (C1).

13 Claims, 6 Drawing Sheets

(56) References Cited

U.S. PATENT DOCUMENTS

| | | | |
|---|---|---|---|
| 8,018,202 B2* | 9/2011 | Masson | G01R 19/16542 |
| | | | 320/116 |
| 2004/0051534 A1* | 3/2004 | Kobayashi | G01R 31/3658 |
| | | | 324/429 |
| 2007/0182348 A1 | 8/2007 | Ooishi | |
| 2009/0066338 A1* | 3/2009 | Yonezawa | G01R 31/3658 |
| | | | 324/426 |
| 2009/0190376 A1 | 7/2009 | Morita | |
| 2010/0164480 A1 | 7/2010 | Morita | |
| 2011/0031812 A1* | 2/2011 | Morimoto | G01R 19/10 |
| | | | 307/77 |
| 2011/0128009 A1* | 6/2011 | Kang | G01R 15/16 |
| | | | 324/434 |

FOREIGN PATENT DOCUMENTS

| | | |
|---|---|---|
| JP | 2002-122643 A | 4/2002 |
| JP | 2002-247771 A | 8/2002 |
| JP | 2002-315212 A | 10/2002 |
| JP | 3791767 B2 | 6/2006 |
| JP | 2007-205853 A | 8/2007 |
| JP | 2007-212443 A | 8/2007 |
| JP | 2009-42080 A | 2/2009 |
| JP | 2009-63511 A | 3/2009 |
| JP | 2010-536027 A | 11/2010 |

\* cited by examiner

VOLTAGE DETECTION CIRCUIT

TECHNICAL FIELD

The present invention relates to a voltage detection circuit.

BACKGROUND ART

Electrically powered vehicles which obtain a vehicle driving force from a motor, such as electric vehicles or hybrid electric vehicles, have a secondary battery mounted therein, and the motor is driven by electric power stored in the secondary battery. Electrically powered vehicles have the function of regenerative braking, that is, braking in which the motor is caused to function as a generator during vehicle braking to convert the kinetic energy of the vehicle to electric energy. The electric energy thus obtained is returned to the secondary battery, and reused during, for example, acceleration.

Because overdischarge or overcharge of a secondary battery will deteriorate the performance of the battery, it is necessary to control charging or discharging while keeping track of the state of charge (SOC) of the secondary battery. For example, in a hybrid electric vehicle, in order that the secondary battery may accommodate regenerative power, or can immediately supply power to the motor when a request is received, the state of charge is controlled to approximately the midpoint (SOC=50% to 60%) between a fully charged state (SOC=100%) and a completely discharged state (SOC=0%). Therefore, it is necessary to accurately detect the SOC of the secondary battery, and to this end, it is necessary to precisely detect the voltage of the secondary battery.

The voltage of the secondary battery can be detected using a flying capacitor. Specifically, a flying capacitor is connected to both ends of the secondary battery with an input side sampling switch being interposed therebetween, and a differential amplifier circuit is connected to the flying capacitor with an output side sampling switch being interposed therebetween. First, the input side sampling switch is turned ON to hold the voltage of the secondary battery in the flying capacitor. Then, the input side sampling switch is turned OFF, and the output side sampling switch is turned ON to supply the voltage stored in the flying capacitor to a non-inverting input terminal and an inverting input terminal of the differential amplifier circuit so that a potential difference between the two input terminals is detected in the differential amplifier circuit to thereby detect the voltage of the flying capacitor, that is, the voltage of the secondary battery. Specifically, an output voltage output from the differential amplifier circuit is supplied to an arithmetic circuit or a CPU (a microprocessor), and the microprocessor reads the output voltage.

PRIOR ART DOCUMENTS

Patent Documents

Patent Document 1: JP 3791767 B
Patent Document 2: JP 2009-63511 A
Patent Document 3: JP 2007-205853 A

SUMMARY OF THE INVENTION

Problems to be Solved by the Invention

In a voltage detection circuit in which a flying capacitor is used, because a voltage stored in the flying capacitor is detected, if the flying capacitor has a larger capacitance, a correspondingly longer time is required to store electricity, and as a result, the voltage measurement time will also be longer. As such, in order to shorten the voltage measurement time, it is necessary to reduce the capacitance of the flying capacitor. However, because a fixed amount of charge stored in the flying capacitor is consumed when the differential amplifier circuit (operational amplifier) detects the voltage, in consideration of voltage detection accuracy, the capacitance of the flying capacitor cannot be simply reduced.

Further, when a secondary battery is composed by connecting a plurality of battery blocks in series, it is necessary to sequentially connect the battery blocks to the flying capacitor by connecting a plurality of input side sampling switches between the secondary battery and the flying capacitor, and sequentially, selectively turning ON the plurality of input side sampling switches (multiplexer). A malfunction of an input side sampling switch will cause a situation in which the voltage of the secondary battery cannot be precisely detected.

An object of the present invention is to provide a voltage detection circuit which uses a capacitor, in which, while voltage detection accuracy is being maintained, the capacitance of the capacitor is reduced to shorten the voltage measurement time. Further, another object of the present invention is to, when a malfunction occurs in the input side sampling switches (multiplexer), easily and quickly detect occurrence of the malfunction.

Means for Solving the Problems

According to the present invention, there is provided a voltage detection circuit for a secondary battery, the voltage detection circuit comprising a main capacitor connected to both terminals of the secondary battery via an input side sampling switch, with the main capacitor being charged by the secondary battery; and a differential amplifier circuit connected to the main capacitor via an output side sampling switch, wherein an output terminal and an inverting input terminal of the differential amplifier circuit are connected via a sub-capacitor.

According to one embodiment of the present invention, the main capacitor is composed of first and second main capacitors connected to each other in series, the differential amplifier circuit is composed of first and second differential amplifier circuits, a connection node between the first main capacitor and the second main capacitor is set to a reference potential, and is connected to non-inverting input terminals of the first and second differential amplifier circuits, a terminal of the first main capacitor located on a side opposite to the connection node is connected to an inverting input terminal of the first differential amplifier circuit, and a terminal of the second main capacitor located on a side opposite to the connection node is connected to an inverting input terminal of the second differential amplifier circuit, and the voltage detection circuit further comprises a circuit for calculating a difference between outputs from the first differential amplifier circuit and the second differential amplifier circuit.

Further, according to another embodiment of the present invention, the voltage detection circuit further comprises a signal source for superimposing a frequency component on the first differential amplifier circuit and the second differential amplifier circuit.

The signal source may be connected to a point either between the secondary battery and the input side sampling switch, or between the first and second main capacitors and the first and second differential amplifier circuits.

Further, according to still another embodiment of the present invention, the signal source is a signal source of an electrical leakage detection circuit.

Advantages of the Invention

By employing the present invention, as a differential amplifier circuit for detecting a voltage of a main capacitor is caused to function as an integrator circuit, the capacitance of the main capacitor can be reduced, and as a result, the voltage detection time can be shortened.

Further, by employing the present invention, as a frequency signal is supplied, a malfunction of an input side sampling switch can be detected with a simple structure.

EMBODIMENTS FOR CARRYING OUT THE INVENTION

Embodiments of the present invention will be described below with reference to the drawings. It should be noted that the following embodiments are given only by way of example, and the present invention is not limited to these embodiments.

1. Basic Structure

Figure 1:
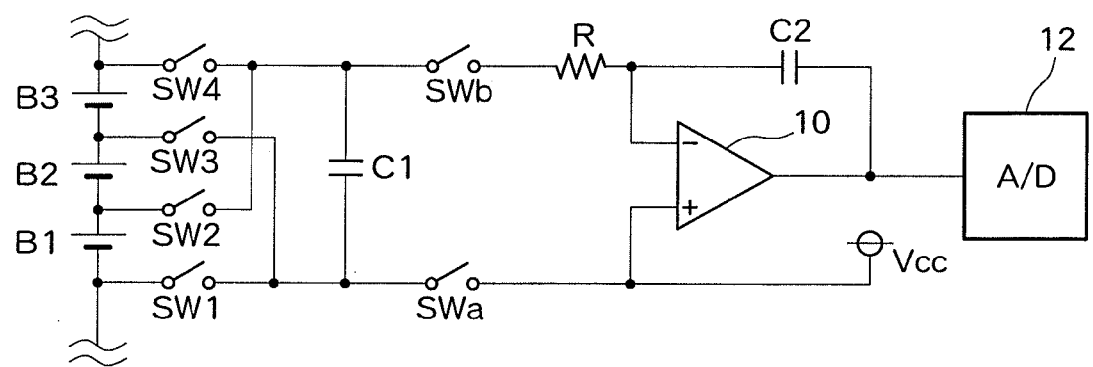
FIG. 1 illustrates a basic circuit structure according to an embodiment of the present invention.

FIG. 1 illustrates a basic circuit structure of a flying capacitor type voltage detection circuit according to an embodiment of the present invention. A secondary battery used herein is a battery pack, and is composed of a plurality of battery blocks connected in series. In FIG. 1, battery blocks B1, B2, and B3 are illustrated by way of example, but the number of battery blocks is not limited to this example. Each battery block is composed of a plurality of battery modules connected in series, and each battery module is further composed of one or more cells connected in series. The secondary battery is mounted in an electrically powered vehicle such as an electric vehicle or a hybrid electric vehicle. The secondary battery is, for example, a nickel-metal hydride battery or a lithium ion battery. Further, in the present invention, the secondary battery is not limited to a battery pack, but may also be composed of a single cell.

Input side sampling switches SW1, SW2, SW3, and SW4 are individually connected to the battery blocks B1, B2, and B3 via a bus. Specifically, an input side sampling switch SW1 is connected to an anode terminal of the battery block B1 via a bus, and an input side sampling switch SW2 is connected to a cathode terminal of the battery block B1 and an anode terminal of the battery block B2 via a bus. Further, an input side sampling switch SW3 is connected to a cathode terminal of the battery block B2 and an anode terminal of the battery block B3 via a bus. Further, an input side sampling switch SW4 is connected to a cathode terminal of the battery block B3 via a bus.

The input side sampling switches SW1 and SW3 are both connected to one terminal of a flying capacitor C1 serving as a main capacitor, and the input side sampling switches SW2 and SW4 are both connected to another terminal of the flying capacitor C1 via a resistor R. The input side sampling switches SW1 to SW4 are formed by a multiplexer.

Further, one terminal of the flying capacitor C1 is connected to a non-inverting input terminal (+) of a differential amplifier circuit (operational amplifier) 10 via an output side sampling switch SWa, and another terminal of the flying capacitor C1 is connected to an inverting input terminal (−) of the differential amplifier circuit 10 via an output side sampling switch SWb and the resistor R. A reference power supply Vcc is connected to the non-inverting input terminal of the differential amplifier circuit 10. Further, a feedback capacitor C2 serving as a sub-capacitor is connected to the inverting input terminal of the differential amplifier circuit 10. The structure in which a feedback capacitor is connected to the inverting input terminal of the differential amplifier circuit 10 is known as an integrator circuit. An output from the differential amplifier circuit 10 is supplied to an arithmetic circuit (or a CPU) 12 which includes an analog-to-digital converter A/D.

In such a structure, voltages of the battery blocks B1 to B3 are sequentially detected. Specifically, first, when the voltage of the battery block B1 is to be detected, SW1 and SW2 are turned ON, and the other switches are turned OFF. By doing so, the flying capacitor C1 is charged with the voltage of the battery block B1, and holds the voltage of the battery block B1. After the flying capacitor C1 is charged, SW1 and SW2 are turned OFF, and the output side sampling switches SWa and SWb are turned ON, so that the voltage of the battery block B1 is detected in a state in which the flying capacitor C1 and the differential amplifier circuit 10 are connected, and the high-voltage battery pack and the differential amplifier circuit 10 are electrically isolated. Specifically, a known reference power supply voltage is input to the non-inverting input terminal of the differential amplifier circuit 10, and a voltage obtained by integrating the voltage of the flying capacitor C1 is input to the inverting input terminal of the differential amplifier circuit 10. A difference value between these voltages is supplied to the arithmetic circuit 12, and the voltage of the battery block B1 is detected.

Further, when the voltage of the battery block B2 is to be detected, SW2 and SW3 are turned ON so that the flying capacitor C1 is charged, and then, SW2 and SW3 are turned OFF, and SWa and SWb are turned ON, so that the voltage of the battery block B2 is similarly detected using the differential amplifier circuit 10. Because the integrator circuit integrates the voltage of the flying capacitor C1 when the voltage of the battery block B1 is being detected, the flying capacitor C1 is discharged in this process, and it is not necessary to separately discharge the flying capacitor C1 before the voltage of the next battery block B2 is detected. This point is one of the advantages obtained by using the integrator circuit. When the voltage of the battery block B3 is to be detected, SW3 and SW4 are turned ON so that the flying capacitor C1 is charged, and then, SW3 and SW4 are turned OFF, and SWa and SWb are turned ON, so that the voltage of the battery block B3 is similarly detected using the differential amplifier circuit 10.

As described above, the flying capacitor type voltage detection circuit according to the present embodiment has a structure in which the differential amplifier circuit 10 for detecting a voltage stored in the flying capacitor C1 is caused to function as a part of the integrator circuit. As a result, the amount of consumption of charge stored in the flying capacitor C1 can be reduced. Therefore, although, in the conventional art, due to the consumption of charge by the differential amplifier circuit 10, it has been difficult to reduce the capacitance of the flying capacitor C1 in terms of detection accuracy, the above-described embodiment makes it possible to reduce the capacitance of the flying capacitor C1 while detection accuracy is being maintained, and as a result, the voltage detection time is shortened compared with the conventional art. Further, because a voltage stored in the flying capacitor C1 is detected using the integrator circuit, in order to charge the flying capacitor C1 in the next instance, it is unnecessary to take steps to discharge the flying capacitor C1 beforehand.

A feature of this embodiment resides in that the differential amplifier circuit for detecting a voltage of the flying capacitor C1 is caused to function as a part of the integrator circuit, in which there may be any number of flying capacitors C1, and a plurality of flying capacitors connected in series to each other may be provided. Further, when a plurality of flying capacitors are provided, a plurality of differential amplifier circuits corresponding to the respective flying capacitors for detecting respective voltages may be provided. In this case, the plurality of differential amplifier circuits are respectively caused to function as apart of the integrator circuit. A structure having a plurality of differential amplifier circuits has an advantage in that, even when common noise specific to the system on which the voltage detection circuit is mounted is introduced into the voltage detection circuit, because the common noise is introduced into respective outputs of the plurality of differential amplifier circuits in the same manner, the common noise can be removed by calculating a difference between these outputs, resulting in an improved voltage detection accuracy.

Next, the structures of embodiments of the present invention will be described in more detail below.

2. First Embodiment

Figure 2:
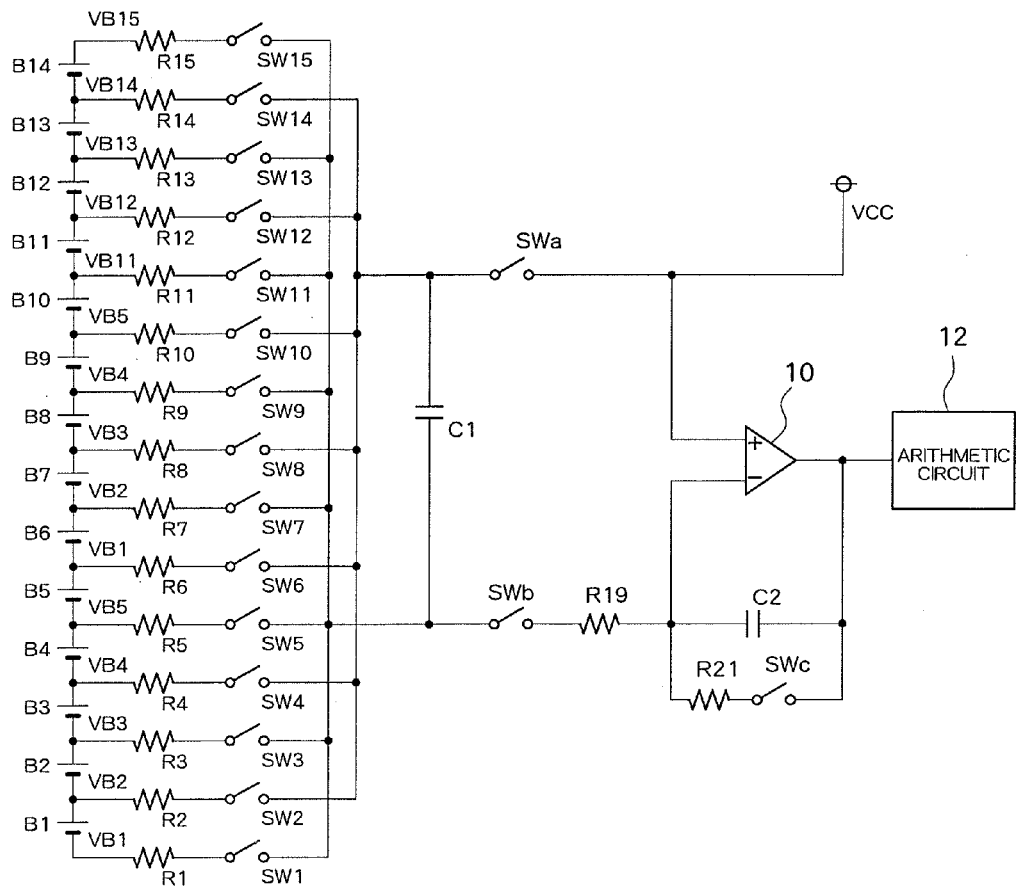
FIG. 2 illustrates a circuit structure according to a first embodiment.

FIG. 2 illustrates a circuit structure of a flying capacitor type voltage detection circuit according to a first embodiment. A battery pack is composed of a plurality of battery blocks B1, B2, . . . , and B14 connected in series. A resistor R1 and an input side sampling switch SW1 are connected to an anode terminal of the battery block B1 via a bus VB1, and a resistor R2 and an input side sampling switch SW2 are connected to a cathode terminal of the battery block B1 via a bus VB2. A resistor R2 and an input side sampling switch SW2 are connected to an anode terminal of the battery block B2 via the bus VB2, and a resistor R3 and an input side sampling switch SW3 are connected to a cathode terminal of the battery block B2 via a bus VB3. The above similarly applies to the other battery blocks. A resistor R14 and an input side sampling switch SW14 are connected to an anode terminal of the battery block B14 via a bus VB14, and a resistor R15 and an input side sampling switch SW15 are connected to a cathode terminal of the battery block B14 via a bus VB15. The resistors R1 to R15 function as current limiting resistors for restricting current passed therethrough.

Among the input side sampling switches SW1 to SW15, the even-numbered switches SW2, SW4, SW6, . . . , and SW14 are all connected in common to one terminal of the flying capacitor C1. Further, the odd-numbered switches SW1, SW3, SW5, . . . , and SW15 are all connected in common to another terminal of the flying capacitor C1.

Further, one terminal of the flying capacitor C1 is connected to a non-inverting input terminal of a differential amplifier circuit 10 via an output side sampling switch SWa, and another terminal of the flying capacitor C1 is connected to an inverting input terminal of the differential amplifier circuit 10 via a resistor R19. A reference power supply Vcc is connected to the non-inverting input terminal of the differential amplifier circuit 10, and a feedback capacitor C2 is connected to the inverting input terminal of the differential amplifier circuit 10 to form an integrator circuit. Further, a resistor R21 and a switch SWc are connected in parallel with the feedback capacitor C2 to provide a structure in which, by turning the switch SWc ON or OFF, the integrator circuit can be selectively operated. An output of the differential amplifier circuit 10 is connected to an arithmetic circuit 12 which includes an analog-to-digital converter A/D.

In such a structure, when the voltage of the battery block B1 is to be detected, SW1 and SW2 are turned ON, and the other input side sampling switches are turned OFF, so that the flying capacitor C1 is charged with the voltage of the battery block B1, and holds the voltage of the battery block B1. Then, SW1 and SW2 are turned OFF, SWa and SWb are turned ON, and SWc is turned OFF, so that the voltage of the flying capacitor C1 is detected by the differential amplifier circuit 10, and is output to the arithmetic circuit 12. By performing similar operations for the other battery blocks, the voltages of the battery blocks B1 to B14 are sequentially detected.

Because the voltages are detected using the integrator circuit, the fixed amount of current consumption is reduced, and the capacitance of the flying capacitor C1 can be reduced. The present inventors have confirmed that the capacitance of the flying capacitor C1 according to the above-described embodiment can be reduced to about one twentieth the capacitance of the flying capacitor C1 in the conventional art, and the voltage detection time per battery block can also be shortened to about one fourth that in the conventional art.

3. Second Embodiment

Figure 3:
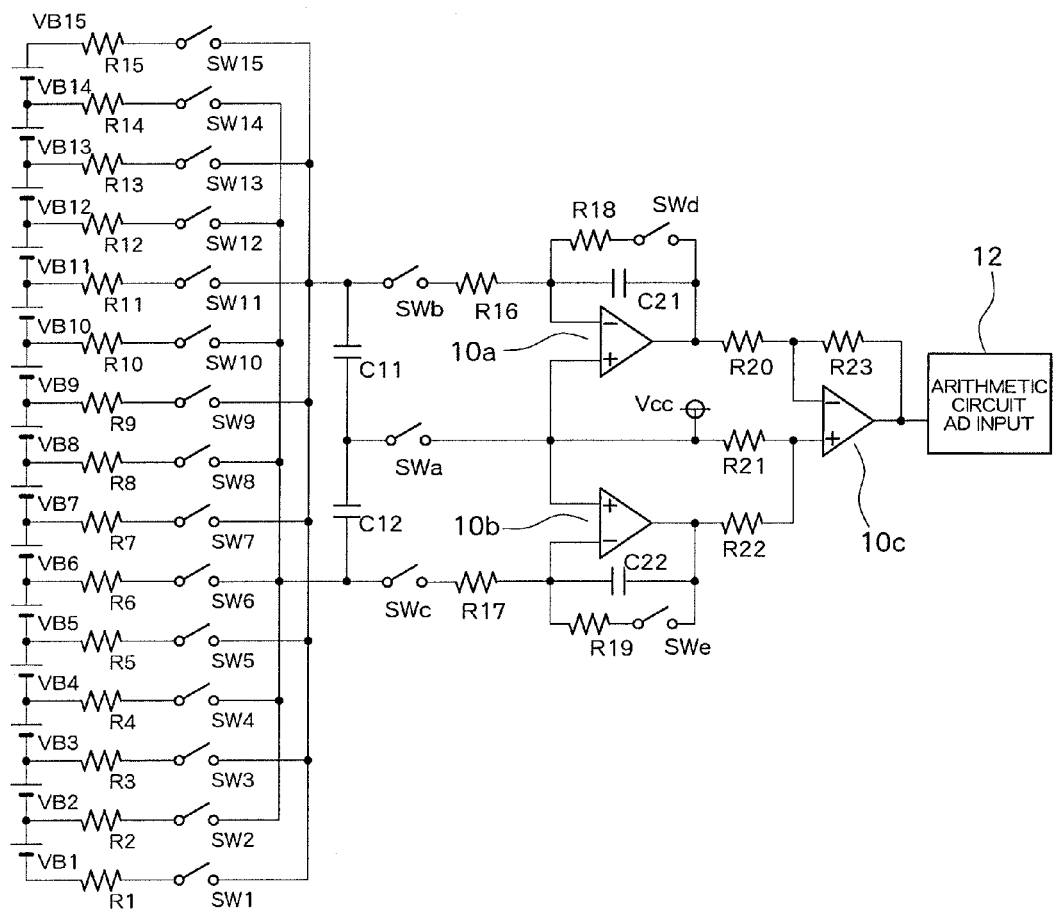
FIG. 3 illustrates a circuit structure according to a second embodiment.

FIG. 3 illustrates a circuit structure according to a second embodiment. This embodiment differs from FIG. 2 in that flying capacitors C11 and C12 are provided as the flying capacitor serving as a main capacitor, and differential amplifier circuits 10a, 10b, and 10c are provided as the differential amplifier circuit.

Among input side sampling switches SW1 to SW15, the odd-numbered switches SW1, SW3, . . . , and SW15 are all connected in common to one terminal of the flying capacitor C11. Another terminal of the flying capacitor C11 is connected to one terminal of the flying capacitor C12. Further, the even-numbered switches SW2, SW4, . . . , and SW14 are all connected in common to another terminal of the flying capacitor C12.

The flying capacitors C11 and C12 are connected in series to each other, and a connection node of the flying capacitors C11 and C12 is connected to a non-inverting input terminal of the differential amplifier circuit 10a and a non-inverting input terminal of the differential amplifier circuit 10b via an output side sampling switch SWa. A terminal of the flying capacitor C11 located on a side opposite to the connection node is connected to an inverting input terminal of the differential amplifier circuit 10a. Further, a terminal of the flying capacitor C12 located on a side opposite to the connection node is connected to an inverting input terminal of the differential amplifier circuit 10b.

The non-inverting input terminal of the differential amplifier circuit 10a and the non-inverting input terminal of the differential amplifier circuit 10b are both connected to a reference power supply Vcc, and are further connected to a non-inverting input terminal of the differential amplifier circuit 10c via a resistor R21. Further, a feedback capacitor C21 serving as a sub-capacitor is connected to the inverting input terminal of the differential amplifier circuit 10a to form an integrator circuit, and a feedback capacitor C22 is also connected to the inverting input terminal of the differential amplifier circuit 10b to form an integrator circuit. A resistor R18 and a switch SWd are connected in parallel with the feedback capacitor C21, and a resistor R19 and a switch SWe are connected in parallel with the feedback capacitor C22, to configure each integrator circuit such that it can be selectively operated. An output of the differential amplifier circuit 10a is connected to an inverting input terminal of the differential amplifier circuit 10c via a resistor R20, and an output of the differential amplifier circuit 10b is connected to the non-inverting input terminal of the differential amplifier circuit 10c via a resistor R22. An output of the differential amplifier circuit 10c is connected to an arithmetic circuit 12 which includes an analog-to-digital converter A/D.

In such a structure, when the voltage of the battery block B1 is to be detected, SW1 and SW2 are turned ON, and the other input side sampling switches are turned OFF, so that the flying capacitors C11 and C12 are charged with the voltage of the battery block B1.

Then, SW1 and SW2 are turned OFF, and the output side sampling switches SWa, SWb, and SWc are turned ON. By doing so, the voltage stored in the flying capacitor C11 is detected by the differential amplifier circuit 10a, and is supplied to the inverting input terminal of the differential amplifier circuit 10c. Further, the voltage stored in the flying capacitor C12 is detected by the differential amplifier circuit 10b, and is supplied to the non-inverting input terminal of the differential amplifier circuit 10c. When the flying capacitors C11 and C12 are configured to have the same capacitance, an output voltage from the differential amplifier circuit 10a and an output voltage from the differential amplifier circuit 10b are approximately the same (polarities are inverted). If common mode noise is present in the detection system, although the common mode noise is introduced into both the output from the differential amplifier circuit 10a and the output from the differential amplifier circuit 10b, the common mode noise is removed because the differential amplifier circuit 10c calculates a difference between these two signals. As described above, a sum of the voltage stored in the flying capacitor C11 and the voltage stored in the flying capacitor C12, that is, the voltage of the battery block B1, is detected, and is supplied to the arithmetic circuit 12. The above similarly applies to the other battery blocks.

4. Third Embodiment

Figure 4:
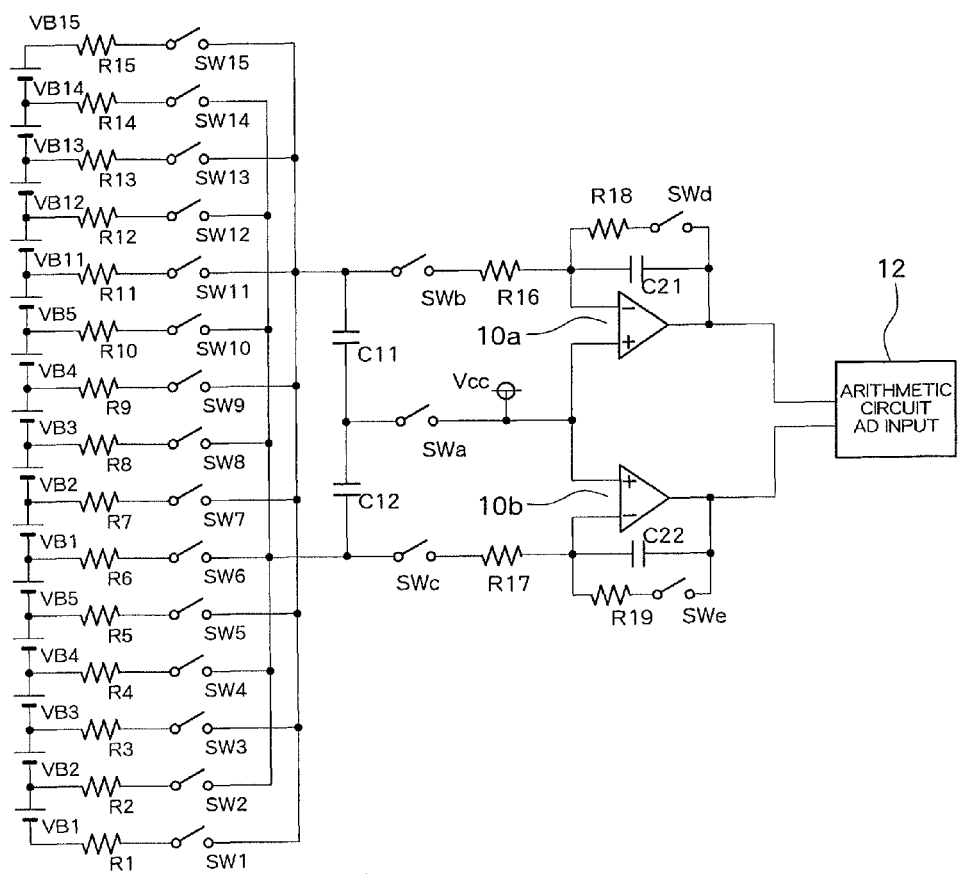
FIG. 4 illustrates a circuit structure according to a third embodiment.

Although in the second embodiment described above the differential amplifier circuit 10c calculates a difference between two signals, this portion can also be processed by the arithmetic circuit 12 using software. FIG. 4 illustrates a circuit structure according to such an embodiment. This embodiment differs from FIG. 3 in that the differential amplifier circuit 10c is not provided, and the arithmetic circuit 12 calculates a difference between two signals. According to this embodiment, while detection accuracy is being improved by removing common mode noise, the number of components can be reduced.

5. Fourth Embodiment

Because, in the embodiments described above, the voltages of the battery blocks B1, B2, and so forth are sequentially detected by sequentially switching the input side sampling switches SW1, SW2, and so forth ON or OFF, if a malfunction occurs in these input side sampling switches SW1, SW2, and so forth, and, for example, a closure failure, that is, a failure in which an input side sampling switch continues to remain in the ON state, occurs, a current limiting resistor which is connected in series to the input side sampling switch or the input side sampling switch may form a short circuit to cause a situation in which the current limiting resistor and the input side sampling switch are heated or broken, the voltages of the battery blocks cannot be detected properly, and as a result, the state of the battery blocks, and in turn the state of the battery pack, may be incorrectly determined.

To address this situation, according to this embodiment, a structure for detecting a closure failure in the input side sampling switches SW1, SW2, and so forth is provided, which will be described below.

Figure 5:
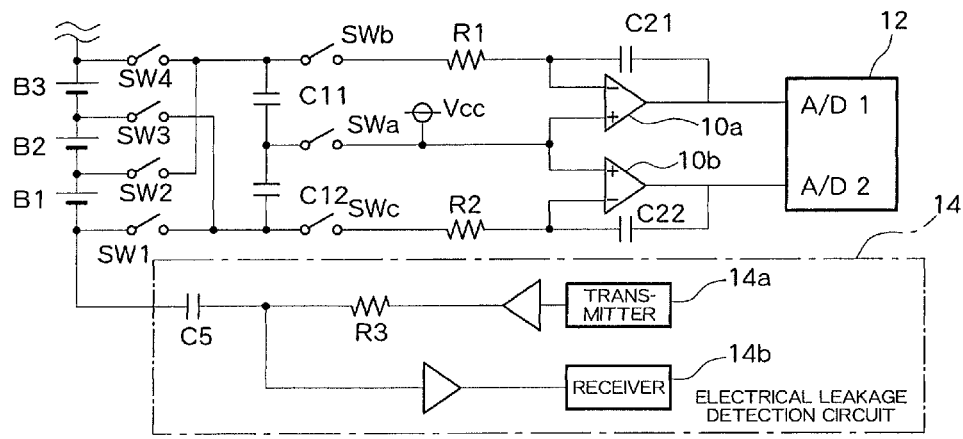
FIG. 5 illustrates a circuit structure according to a fourth embodiment.

FIG. 5 illustrates a circuit structure according to this embodiment. The basic structure is as illustrated in FIG. 4, and this structure is shown in a simplified view.

Specifically, battery blocks B1, B2, and B3 are connected to each other in series, an input side sampling switch SW1 is connected to an anode terminal of the battery block B1 via a bus, and an input side sampling switch SW2 is connected to a cathode terminal of the battery block B1 and an anode terminal of the battery block B2 via a bus. An input side sampling switch SW3 is connected to a cathode terminal of the battery block B2 and an anode terminal of the battery block B3 via a bus, and an input side sampling switch SW4 is connected to a cathode terminal of the battery block B3 via a bus. SW2 and SW4 are both connected in common to one terminal of a flying capacitor C11, and another terminal of the flying capacitor C11 is connected to one terminal of a flying capacitor C12. The flying capacitors C11 and C12 are connected to each other in series. SW1 and SW3 are both connected in common to another terminal of the flying capacitor C12.

A connection node of the flying capacitors C11 and C12 is connected to a reference power supply Vcc via an output side sampling switch SWa, and is further connected to non-inverting input terminals of differential amplifier circuits 10a and 10b. The terminal of the flying capacitor C11 to which SW2 and SW4 are connected is connected to an inverting input terminal of the differential amplifier circuit 10a via an output side sampling switch SWb and a resistor R1. Further, the terminal of the flying capacitor C12 to which SW1 and SW3 are connected is connected to an inverting input terminal of the differential amplifier circuit 10b via an output side sampling switch SWc and a resistor R2. A feedback capacitor C21 is connected to the inverting input terminal of the differential amplifier circuit 10a to form an integrator circuit, and a feedback capacitor C22 is also connected to the inverting input terminal of the differential amplifier circuit 10b to form an integrator circuit. Outputs of the differential amplifier circuits 10a and 10b are connected to an arithmetic circuit 12. The arithmetic circuit 12 includes analog-to-digital converters A/D for converting signals output from the differential amplifier circuits 10a and 10b respectively into digital signals, and calculates a difference between these two signals to remove common mode noise.

On the other hand, in addition to such a flying capacitor type voltage detection circuit, an electrical leakage detection circuit 14 is provided in the system to detect electrical leakage occurring within the system. The electrical leakage detection circuit includes a transmitter 14a for transmitting a frequency signal, and a receiver 14b for receiving a frequency signal. Although when there is no electrical leakage, the receiver receives a frequency signal having a certain strength, occurrence of a certain electrical leakage within the system causes the reception strength to change, and the presence or absence of electrical leakage within the system is detected by detecting this change in strength.

The present embodiment is achieved with the help of the electrical leakage detection circuit 14. The electrical leakage detection circuit 14 is connected to the flying capacitor type voltage detection circuit. Specifically, the transmitter 14a of the electrical leakage detection circuit 14 is connected to a point between the anode terminal of the battery block B1 and the input side sampling switch SW1 via a resistor R3 and a capacitor C5 to supply a frequency signal coming from the transmitter 14a to the voltage detection circuit.

In a normal state in which there is no closure failure in the input side sampling switches SW1 to SW4, as described above, an output from the differential amplifier 10a and an output from the differential amplifier 10b are approximately the same (signs are inverted). However, occurrence of a closure failure somewhere in the input side sampling switches SW1 to SW4 causes a change in impedance of the voltage detection circuit, and a difference between outputs from the differential amplifier circuits 10a and 10b arises in response to a frequency signal coming from the transmitter 14a. Specifically, although when the input side sampling switches SW1 to SW4 are all operating properly, the differential amplifier circuits 10a and 10b are symmetrical to each other in terms of circuit configuration and also have an equal impedance based on the assumption that the flying capacitors C11 and C12 have the same capacitance when only SW1 and SW2 are turned ON to detect a voltage of the battery block B1, for example, occurrence of a closure failure in SW3 causes a change in impedance of the circuit to which SW3 is connected, which distorts the symmetry of the differential amplifier circuits 10a and 10b, and causes the output voltages to vary. By detecting a difference between outputs from the differential amplifier circuits 10a and 10b, the arithmetic circuit 12 detects a closure failure occurring in the input side sampling switches SW1 to SW4.

The transmitter 14a can transmit any signal having a frequency component, and, for example, any of a rectangular wave, a sinusoidal wave, a triangular wave, or a pulse wave may be used.

Additionally, it should also be noted that, although JP 2009-42080 A discloses a signal generator for applying common mode noise to a flying capacitor circuit, and discloses, while recognizing that when a failure has occurred in a differential amplifier circuit the filter characteristics will deteriorate, detecting the failure of the differential amplifier circuit by detecting insufficient attenuation of an output voltage from the differential amplifier circuit, JP 2009-42080 A nowhere discloses any idea concerning a closure failure occurring in the input side sampling switches SW1, SW2, and so forth as in the above-described embodiment, and nowhere discloses detecting a failure by paying attention to a difference between output voltages from two differential amplifier circuits 10a and 10b, as in the above-described embodiment.

6. Other Modification Examples

Although, in the structure illustrated in FIG. 5, a closure failure in the input side sampling switches SW1, SW2, and so forth of the voltage detection circuit is detected with the help of the electrical leakage detection circuit 14 which is provided in the system, a different signal source may be connected to the voltage detection circuit, in place of the electrical leakage detection circuit 14.

Figure 6:
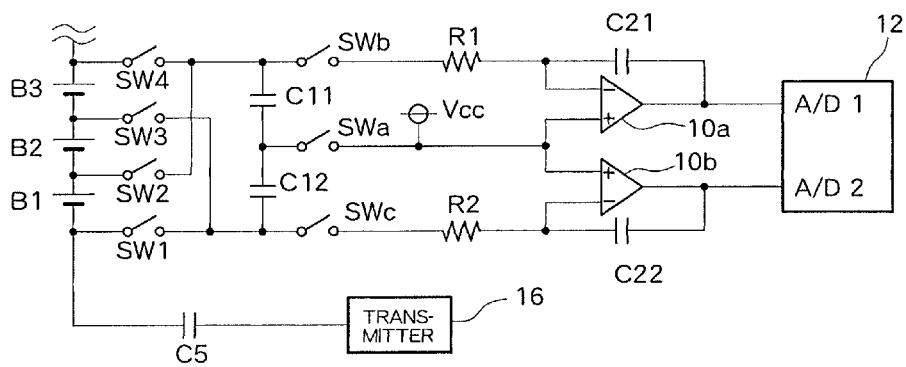
FIG. 6 illustrates a circuit structure according to a modification example.

FIG. 6 illustrates a modification example of FIG. 5. In this structure, a transmitter 16 is provided in place of the electrical leakage detection circuit 14, and is connected to a point between the battery block B1 and the input side sampling switch SW1 via the capacitor C5. The transmitter 16 supplies a frequency signal in a similar manner to the transmitter 14a. As the frequency signal, any of a rectangular wave, a sinusoidal wave, a triangular wave, or a pulse wave may be used.

Figure 7:
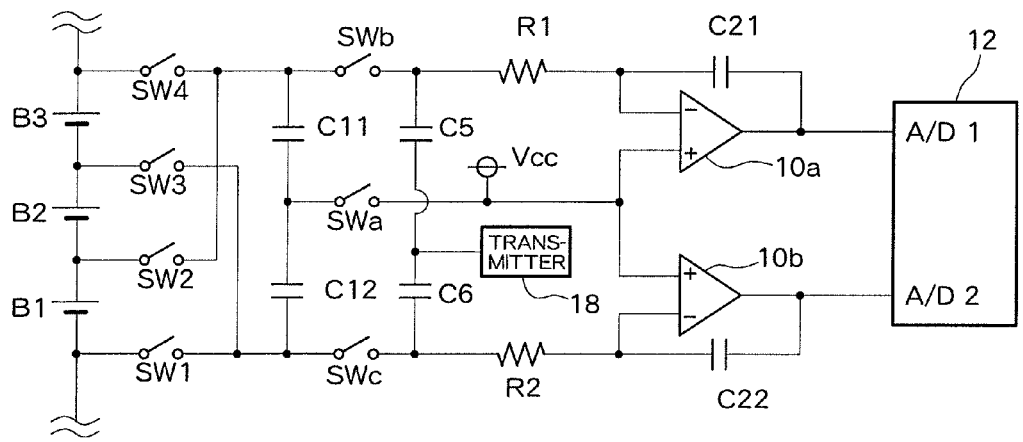
FIG. 7 illustrates a circuit structure according to another modification example.

FIG. 7 illustrates another modification example of FIG. 5. In this structure, a transmitter 18 is provided in place of the electrical leakage detection circuit 14. The transmitter 18 is connected to a point between the output side sampling switch SWb and the resistor R1 via the capacitor C5, and is connected to a point between the output side sampling switch SWc and the resistor R2 via a capacitor C6. The transmitter 18 supplies a frequency signal in a similar manner to the transmitter 14a.

Figure 8:
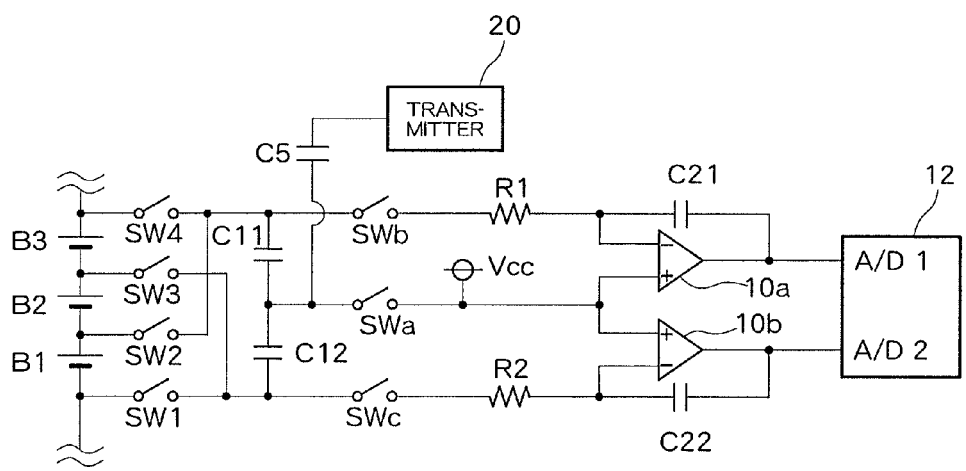
FIG. 8 illustrates a circuit structure according to still another modification example.

FIG. 8 illustrates still another modification example of FIG. 5. In this structure, a transmitter 20 is provided in place of the electrical leakage detection circuit 14, and is connected to a point between the connection node of the flying capacitors C11 and C12 and the output side sampling switch SWa via the capacitor C5. The transmitter 20 supplies a frequency signal in a similar manner to the transmitter 14a.

Although the embodiments of the present invention have been described above, the present invention is not limited to these embodiments, and still other modification examples are also possible.

For example, although, referring to FIGS. 6 to 8, a frequency signal is supplied from the transmitter 16, 18, or 20, it is not always necessary for the signal to be supplied to be periodic. Any signal having a frequency component other than a direct current signal may be supplied. It is also possible to employ a structure in which common mode noise is supplied.

Further, in the structure illustrated in FIG. 5, the electrical leakage detection circuit 14 may also be connected to a point between the output side sampling switches SWb and SWc and the differential amplifier circuits 10a and 10b as illustrated in FIG. 7. Further, in the structures illustrated in FIGS. 6 to 8, instead of providing the transmitter 16, 18, or 20, it is also possible to employ a structure in which a frequency component is superimposed on the reference power supply Vcc which is connected to the non-inverting input terminals of the differential amplifier circuits 10a and 10b.

Further, the location where a transmitter is connected is not limited to those employed in the above-described embodiments, and a transmitter may be connected to any location where a frequency component can be superimposed on the differential amplifier circuits 10a and 10b when the input side sampling switches SW1 to SW4 are all operating properly.

Further, although, in the above-described embodiments, an equivalent frequency component is superimposed on the differential amplifier circuits 10a and 10b, it is also possible to employ a structure in which different values are superimposed. In such cases, voltage measurement and closure failure detection may be performed by taking into consideration the influence of superimposed frequencies.

REFERENCE NUMERALS 10, 10a, 10b, 10c DIFFERENTIAL AMPLIFIER CIRCUIT
12 ARITHMETIC CIRCUIT
14 ELECTRICAL LEAKAGE DETECTION CIRCUIT
16, 18, 20 TRANSMITTER
C1, C2, C11, C12 FLYING CAPACITOR (MAIN CAPACITOR)
C2, C21, C22 FEEDBACK CAPACITOR (SUB-CAPACITOR)

The invention claimed is:

1. A voltage detection circuit for a secondary battery, the voltage detection circuit comprising: a main capacitor connected to both terminals of the secondary battery via an input side sampling switch, the main capacitor being charged by the secondary battery; and a differential amplifier circuit connected to the main capacitor via an output side sampling switch, wherein an output terminal of the differential amplifier circuit is connected to an inverting input terminal of the differential amplifier circuit via a sub-capacitor, and wherein the output terminal of the differential amplifier circuit is connected to the inverting input terminal of the differential amplifier circuit via a resistor and a switch in series; and the resistor and the switch are further connected in parallel with the feedback capacitor to provide a structure in which, by turning the switch ON and OFF, the integrator circuit is selectively operated.

2. A voltage detection circuit for a secondary battery, the voltage detection circuit comprising: a main capacitor connected to both terminals of the secondary battery via an input side sampling switch, the main capacitor being charged by the secondary battery; and a differential amplifier circuit connected to the main capacitor via an output side sampling switch, wherein an output terminal of the differential amplifier circuit is connected to an inverting input terminal of the differential amplifier circuit via a sub-capacitor, the output terminal of the differential amplifier circuit is connected to the inverting input terminal of the differential amplifier circuit via a resistor and a switch that are connected in series, and after the main capacitor is charged by the secondary battery, a voltage of the secondary battery is detected by turning the input side sampling switch OFF, turning the output side sampling switch ON, and turning the switch connected in parallel with the sub-capacitor OFF; and the resistor and the switch are further connected in parallel with the feedback capacitor to provide a structure in which, by turning the switch ON and OFF, the integrator circuit is selectively operated.

3. The voltage detection circuit according to claim 1, wherein
the main capacitor is composed of first and second main capacitors connected to each other in series,
the differential amplifier circuit is composed of first and second differential amplifier circuits,
a connection node between the first main capacitor and the second main capacitor is set to a reference potential, and is connected to non-inverting input terminals of the first and second differential amplifier circuits,
a terminal of the first main capacitor located on a side opposite to the connection node is connected to an inverting input terminal of the first differential amplifier circuit, and
a terminal of the second main capacitor located on a side opposite to the connection node is connected to an inverting input terminal of the second differential amplifier circuit,
the voltage detection circuit further comprising a circuit in which:
when common mode noise is present in the voltage detection circuit for the secondary battery, the common mode noise is introduced into both outputs from the first differential amplifier circuit and the second differential amplifier circuit, and
the common mode noise is removed by calculating a difference between the outputs from the first differential amplifier circuit and the second differential amplifier circuit.

4. The voltage detection circuit according to claim 1, wherein
the main capacitor is composed of first and second main capacitors connected to each other in series,
the differential amplifier circuit is composed of first and second differential amplifier circuits,
a connection node between the first main capacitor and the second main capacitor is set to a reference potential, and is connected to non-inverting input terminals of the first and second differential amplifier circuits,
a terminal of the first main capacitor located on a side opposite to the connection node is connected to an inverting input terminal of the first differential amplifier circuit, and
a terminal of the second main capacitor located on a side opposite to the connection node is connected to an inverting input terminal of the second differential amplifier circuit,
the voltage detection circuit further comprising:
a circuit which comprises a signal source for superimposing a frequency component on the first differential amplifier circuit and the second differential amplifier circuit, and which calculates a difference between outputs from the first differential amplifier circuit and the second differential amplifier circuit to detect a closure failure of the input side sampling switch.

5. The voltage detection circuit according to claim 4, wherein
the signal source is connected to a point between the secondary battery and the input side sampling switch.

6. The voltage detection circuit according to claim 4, wherein
the signal source is connected to a point between the first and second main capacitors and the first and second differential amplifier circuits.

7. A voltage detection circuit for a secondary battery, the voltage detection circuit comprising:
a main capacitor connected to both terminals of the secondary battery via an input side sampling switch, the main capacitor charged by the secondary battery; and
a differential amplifier circuit connected to the main capacitor via an output side sampling switch, wherein
an output terminal and an inverting input terminal of the differential amplifier circuit are connected via a sub-capacitor,
the main capacitor is composed of first and second main capacitors connected to each other in series, the differential amplifier circuit is composed of first and second differential amplifier circuits,
a connection node between the first main capacitor and the second main capacitor is set to a reference potential, and is connected to non-inverting input terminals of the first and second differential amplifier circuits,
a terminal of the first main capacitor located on a side opposite to the connection node is connected to an inverting input terminal of the first differential amplifier circuit, and
a terminal of the second main capacitor located on a side opposite to the connection node is connected to an inverting input terminal of the second differential amplifier circuit,
the voltage detection circuit further comprising a circuit for calculating a difference between outputs from the first differential amplifier circuit and the second differential amplifier circuit, and
comprising a signal source for superimposing a frequency component on the first differential amplifier circuit and the second differential amplifier circuit, wherein
the signal source is a signal source of an electrical leakage detection circuit.

8. The voltage detection circuit according to claim 7, wherein
the signal source is connected to a point between the secondary battery and the input side sampling switch.

9. The voltage detection circuit according to claim 7, wherein
the signal source is connected to a point between the first and second main capacitors and the first and second differential amplifier circuits.

10. The voltage detection circuit according to claim 2, wherein
the main capacitor is composed of first and second main capacitors connected to each other in series,
the differential amplifier circuit is composed of first and second differential amplifier circuits,
a connection node between the first main capacitor and the second main capacitor is set to a reference potential, and is connected to non-inverting input terminals of the first and second differential amplifier circuits,
a terminal of the first main capacitor located on a side opposite to the connection node is connected to an inverting input terminal of the first differential amplifier circuit, and
a terminal of the second main capacitor located on a side opposite to the connection node is connected to an inverting input terminal of the second differential amplifier circuit,
the voltage detection circuit further comprising a circuit in which:
when common mode noise is present in the voltage detection circuit for the secondary battery, the common mode noise is introduced into both outputs from the first differential amplifier circuit and the second differential amplifier circuit, and
the common mode noise is removed by calculating a difference between the outputs from the first differential amplifier circuit and the second differential amplifier circuit.

11. The voltage detection circuit according to claim 2, wherein
the main capacitor is composed of first and second main capacitors connected to each other in series,
the differential amplifier circuit is composed of first and second differential amplifier circuits,
a connection node between the first main capacitor and the second main capacitor is set to a reference potential, and is connected to non-inverting input terminals of the first and second differential amplifier circuits,
a terminal of the first main capacitor located on a side opposite to the connection node is connected to an inverting input terminal of the first differential amplifier circuit, and
a terminal of the second main capacitor located on a side opposite to the connection node is connected to an inverting input terminal of the second differential amplifier circuit,
the voltage detection circuit further comprising:
a circuit which comprises a signal source for superimposing a frequency component on the first differential amplifier circuit and the second differential amplifier circuit, and which calculates a difference between outputs from the first differential amplifier circuit and the second differential amplifier circuit to detect a closure failure of the input side sampling switch.

12. The voltage detection circuit according to claim 11, wherein
the signal source is connected to a point between the secondary battery and the input side sampling switch.

13. The voltage detection circuit according to claim 11, wherein
the signal source is connected to a point between the first and second main capacitors and the first and second differential amplifier circuits.

* * * * *